(12) United States Patent
Yu

(10) Patent No.: US 11,374,051 B2
(45) Date of Patent: Jun. 28, 2022

(54) PHOTOELECTRIC CONVERSION ARRAY SUBSTRATE AND PHOTOELECTRIC CONVERSION DEVICE

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventor: Gang Yu, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 142 days.

(21) Appl. No.: 16/640,488

(22) PCT Filed: Aug. 1, 2019

(86) PCT No.: PCT/CN2019/098799
§ 371 (c)(1),
(2) Date: Feb. 20, 2020

(87) PCT Pub. No.: WO2020/025014
PCT Pub. Date: Feb. 6, 2020

(65) Prior Publication Data
US 2020/0176506 A1    Jun. 4, 2020

(30) Foreign Application Priority Data

Aug. 1, 2018  (CN) .......................... 201821237694.0

(51) Int. Cl.
*H01L 27/146*  (2006.01)
*G01T 1/20*  (2006.01)
*H01L 31/0224*  (2006.01)

(52) U.S. Cl.
CPC ...... *H01L 27/14663* (2013.01); *G01T 1/2018* (2013.01); *H01L 27/1462* (2013.01);
(Continued)

(58) Field of Classification Search
CPC ......... H01L 27/14663; H01L 27/14612; H01L 27/1462; H01L 27/14623; H01L 27/14636; H01L 31/022466; G01T 1/2018
(Continued)

(56) References Cited

U.S. PATENT DOCUMENTS 10,615,201 B2 * 4/2020 Sekine et al. ..... H01L 27/14612
2011/0095195 A1 * 4/2011 Imai .................. H01L 29/66969
257/43
(Continued)

FOREIGN PATENT DOCUMENTS

CN    102157533 A  *  8/2011  ........... H01L 27/146
CN    102157533 A      8/2011
(Continued)

OTHER PUBLICATIONS

International Search Report and Written Opinion for Application No. PCT/CN2019/098799, dated Nov. 1, 2019, dated 10 Pages.

*Primary Examiner* — Ismail A Muse
*Assistant Examiner* — Wasiul Haider
(74) *Attorney, Agent, or Firm* — Brooks Kushman P.C.

(57) ABSTRACT

The present disclosure provides a photoelectric conversion array substrate and a photoelectric conversion device, and the photoelectric conversion array substrate includes: a base substrate; a thin film transistor located on the base substrate
(Continued)

and including a gate, a gate insulating layer disposed on the gate, an active layer disposed on the gate insulating layer, and a source electrode and a drain electrode located on the active layer; a photodetection unit located on the base substrate and including a signal output electrode, a photosensitive layer and a transparent electrode that are located on the base substrate, the signal output electrode electrically connected to the drain electrode, wherein an orthographic projection of the transparent electrode on the base substrate is located within an orthographic projection of the photosensitive layer on the base substrate; a first protective layer covering the source electrode and the drain electrode.

9 Claims, 3 Drawing Sheets

(52) U.S. Cl.
CPC .. *H01L 27/14612* (2013.01); *H01L 27/14623* (2013.01); *H01L 27/14636* (2013.01); *H01L 31/022466* (2013.01)

(58) Field of Classification Search
USPC ........................................................ 257/72
See application file for complete search history.

(56) References Cited

U.S. PATENT DOCUMENTS

| | | | |
|---|---|---|---|
| 2012/0242624 A1* | 9/2012 | Tomiyasu et al. ... | G06K 9/0004 250/227.11 |
| 2015/0270299 A1* | 9/2015 | Gao et al. ............ | G06K 9/0004 250/227.11 |
| 2015/0340511 A1* | 11/2015 | Yan .................... | H01L 29/66969 257/43 |
| 2015/0369661 A1* | 12/2015 | Lin ...................... | G06K 9/0004 250/227.11 |
| 2018/0196147 A1* | 7/2018 | Kang et al. ........... | G01T 1/2023 |
| 2020/0176506 A1* | 6/2020 | Yu ...................... | H01L 27/14612 |
| 2021/0202779 A1* | 7/2021 | Hou et al. ............. | H01L 31/115 |

FOREIGN PATENT DOCUMENTS

| | | | | | |
|---|---|---|---|---|---|
| CN | 102664184 A | * | 9/2012 | ....... | H01L 27/14658 |
| CN | 102664184 A | | 9/2012 | | |
| CN | 107195647 A | * | 9/2017 | ....... | H01L 27/14632 |
| CN | 107195647 A | | 9/2017 | | |
| CN | 208422918 U | * | 1/2019 | ........... | H01L 29/786 |
| CN | 208422918 U | | 1/2019 | | |

* cited by examiner

PHOTOELECTRIC CONVERSION ARRAY SUBSTRATE AND PHOTOELECTRIC CONVERSION DEVICE

CROSS-REFERENCE TO RELATED APPLICATIONS

This application is the U.S. national phase of PCT Application No. PCT/CN2019/098799 filed on Aug. 1, 2019, which claims priority to Chinese Patent Application No. 201821237694.0, filed on Aug. 1, 2018, which are incorporated herein by reference in their entireties.

TECHNICAL FIELD

The present disclosure relates to the field of photoelectric technology, and in particular to a photoelectric conversion array substrate and a photoelectric conversion device.

BACKGROUND

The X-ray detection is widely used in medical, safety, non-destructive testing, scientific research and other fields, which is playing an increasingly important role in national economy and people's livelihood. At present, the more common X-ray detection technology is the X-Ray Digital Radiography (XDR) detection technology that appeared in the late 1990s. XRD sensor technology has high requirements for imaging accuracy, and weak leakage current will influence imaging quality and cause misjudgment.

SUMMARY

At least one embodiment of the present disclosure provides a photoelectric conversion array substrate, which includes: a base substrate; a thin film transistor located on the base substrate, wherein the thin film transistor includes a gate, a gate insulating layer disposed on the gate, an active layer disposed on the gate insulating layer, and a source electrode and a drain electrode located on the active layer; a photodetection unit located on the base substrate, wherein the photodetection unit includes a signal output electrode located on the base substrate, a photosensitive layer located on the signal output electrode, and a transparent electrode located on the photosensitive layer, the signal output electrode is electrically connected to the drain electrode, and an orthographic projection of the transparent electrode on the base substrate is located within an orthographic projection of the photosensitive layer on the base substrate; a first protective layer covering the source electrode and the drain electrode, wherein a first light shielding layer is disposed on the first protective layer, an orthographic projection of the first light shielding layer on the base substrate covers at least an orthographic projection of the active layer on the base substrate.

Optionally, the signal output electrode is opaque, and the signal output electrode and the first light shielding layer are formed in a same layer and made of a same material.

Optionally, the signal output electrode and the first light shielding layer are connected into an integrated structure.

Optionally, a portion of the first protective layer covers the source electrode and the drain electrode, and a first via is disposed at a position corresponding to the drain electrode; another portion of the first protective layer covers the gate insulating layer, the photodetection unit is disposed on the portion of the first protective layer that covers the gate insulating layer, and the signal output electrode is electrically connected to the drain electrode through the first via.

Optionally, the photodetection unit and the thin film transistor are further covered with a flat layer; the flat layer is covered with a second protective layer; the photoelectric conversion array substrate is further provided with a signal line, the signal line is disposed on the second protective layer, the flat layer and the second protective layer are disposed with a second via at a position corresponding to the transparent electrode of the photodetection unit, and the signal line is electrically connected with the transparent electrode through the second via.

Optionally, the photoelectric conversion array substrate further includes a second light shielding layer disposed on a same layer as the signal line, wherein the second light shielding layer is integrated with the signal line.

Optionally, a third protective layer covering the signal line is disposed on the second protective layer.

Optionally, a distance between an edge of the orthographic projection of the transparent electrode on the base substrate and an edge of the orthographic projection of the photosensitive layer on the base substrate is 1-3 microns.

Optionally, a distance between an edge of the orthographic projection of the transparent electrode on the base substrate and an edge of the orthographic projection of the photosensitive layer on the base substrate is 2 microns.

Optionally, the orthographic projection of the photosensitive layer on the base substrate is located within an orthographic projection of the signal output electrode on the base substrate.

Optionally, a minimum distance between an edge of the orthographic projection of the photosensitive layer on the base substrate and an edge of the orthographic projection of the signal output electrode on the base substrate is 1-6 microns.

Optionally, the photoelectric conversion array substrate further includes: a scintillation layer located on a side of the photosensitive layer away from the base substrate, and configured for converting X-ray photons into visible light.

At least one embodiment of the present disclosure provides a photoelectric conversion device which includes the photoelectric conversion array substrate as described above.

DETAILED DESCRIPTION

In order to make the objects, technical solutions and advantages of the present disclosure more clear, the technical solutions of the present disclosure will be clearly and completely described below with reference to the drawings of the present disclosure. Apparently, the described embodiments are some embodiments of the present disclosure, but are not all the embodiments. Based on the embodiments of the present disclosure, all other embodiments derived by a person of ordinary skill in the art without any creative efforts shall fall within the scope of the present disclosure.

Before the photoelectric conversion array substrate provided by the present disclosure is described in detail, it is necessary to describe the photoelectric conversion array substrate in the related art.

The photoelectric conversion array substrate of the XRD sensor includes a thin film transistor (TFT) switch and a photodetection unit. The photodetection unit includes a transparent electrode, a signal output electrode, and a photosensitive layer located between the transparent electrode and the signal output electrode. Under X-ray irradiation, a scintillator layer and a phosphor layer in the photosensitive layer convert X-ray photons into visible light, and then convert the visible light into electrical signals under the action of a photodiode. The thin film transistor reads the electric signals and outputs the electric signals to obtain a display image.

In a photoelectric conversion array substrate in the related art, a component such as a thin film transistor (TFT) switch is sensitive to light, while the XRD sensor changes the current of the photodetection unit through light, and then performs integral imaging. Therefore, leakage current, generated due to the TFT switch influenced by light, will influence the photodetection unit, and then influence the imaging accuracy.

In the related art, a light shielding layer is disposed above the thin film transistor to shield the thin film transistor to avoid leakage current generated due to the TFT switch influenced by light. However, in the related art, a distance between the light shielding layer and the thin film transistor is relatively large, and the light shielding effect is poor.

Figure 1:
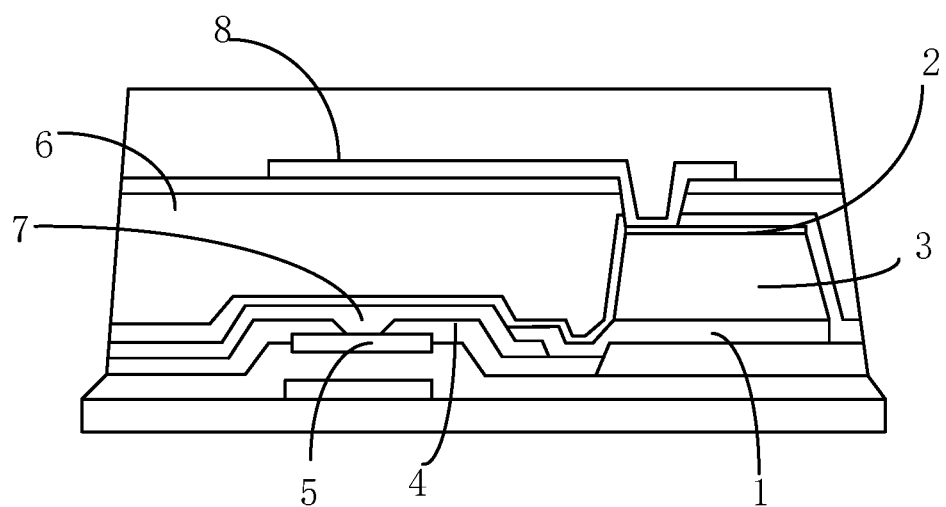
FIG. 1 is a schematic structural diagram illustrating a photoelectric conversion array substrate in the related art.

FIG. 1 is a schematic structural diagram of a photoelectric conversion array substrate in the related art.

As shown in FIG. 1, a photodetection unit of the photoelectric conversion array substrate includes a signal output electrode 1, a transparent electrode 2 and a photosensitive layer 3 located between the transparent electrode 2 and the signal output electrode 1, the signal output electrode 1 is only electrically connected to a drain electrode 4 of the thin film transistor, but does not cover an active layer 5 of the thin film transistor. A light shielding layer 8 is separately disposed above each film layer, such as a flat layer 6, and a protective layer 7, etc., so as to shield the thin film transistor. However, in this way, on one hand, a light shielding layer is required to be separately disposed; on the other hand, the distance between the light shielding layer and the thin film transistor is relatively large, and a problem of poor light shielding effect occurs under light condition.

Aiming at the problem that the thin film transistor on the photoelectric conversion array substrate of the photoelectric sensor in the related art is liable to generate a leakage current under light condition, thereby resulting in a poor detection accuracy of the photoelectric sensor, an embodiment of the present disclosure provides a photoelectric conversion array substrate, a display panel and a display device, which effectively improve the light sensing characteristics of the component, the TFT switch circuit, and reduce the leakage current, thereby improving the imaging accuracy of the photoelectric detection, and avoiding misjudgment during imaging.

Figure 2:
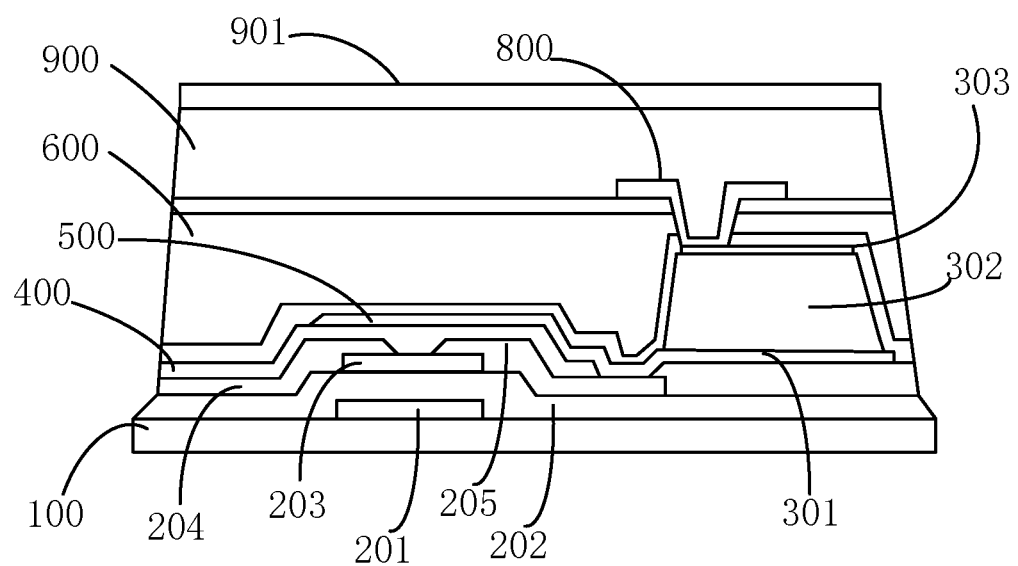
FIG. 2 is a schematic structural diagram illustrating a photoelectric conversion array substrate provided by an embodiment of the present disclosure.

FIG. 2 is a schematic structural diagram of a photoelectric conversion array substrate according to an embodiment of the present disclosure.

As shown in FIG. 2, the photoelectric conversion array substrate provided by the embodiment of the present disclosure includes:

a base substrate 100;

a thin film transistor located on the base substrate 100, wherein the thin film transistor includes a gate 201, a gate insulating layer 202 disposed on the gate 201, an active layer 203 disposed on the gate insulating layer 202, and a source electrode 204 and a drain electrode 205 located on the active layer 203; and a photodetection unit located on the base substrate 100, wherein the photodetection unit includes a signal output electrode 301 located on the base substrate 100, a photosensitive layer 302 located on the signal output electrode 301, and a transparent electrode 303 located on the photosensitive layer 302, the signal output electrode 301 is electrically connected to the drain electrode 205;

wherein a first protective layer 400 covers the source electrode 204 and the drain electrode 205, a first light shielding layer 500 is disposed on the first protective layer 400, an orthographic projection of the first light shielding layer 500 on the base substrate 100 covers at least an orthographic projection of the active layer 203 on the base substrate 100.

In the photoelectric conversion array substrate shown in FIG. 2, an orthographic projection of the transparent electrode 303 on the base substrate 100 is located within an orthographic projection of the photosensitive layer 302 on the base substrate 100, and the orthographic projection of the photosensitive layer 302 on the base substrate 100 is located within an orthographic projection of the signal output electrode 301 on the base substrate 100.

In the above solution, the first light shielding layer 500 is disposed directly above the first protective layer 400 over the source electrode 204 and the drain electrode 205 of the thin film transistor, so that the distance between the first light shielding layer 500 and the thin film transistor is short, and the light shielding effect is high, which may effectively reduce a phenomenon that the thin film transistor generates a leakage current under light condition, thereby improving detection accuracy of the photodetection unit on the photoelectric conversion array substrate.

Optionally, a distance D1 between an edge of the orthographic projection of the transparent electrode 303 on the base substrate 100 and an edge of the orthographic projection of the photosensitive layer 302 on the base substrate 100 is 1-3 microns. Optionally, the distance is 1.5, 2, or 2.5 microns.

Optionally, a minimum distance D2 between an edge of the orthographic projection of the photosensitive layer 302 on the base substrate 100 and an edge of the orthographic projection of the signal output electrode 301 on the base substrate 100 is 1-6 microns. According to some embodiments of the present disclosure, the distance may be 2, 2.5, 3, 4 or 5 microns, which may be set according to specific design requirements, which does not constitute any limitation here.

In addition, in a preferred embodiment provided by the present disclosure, as shown in FIG. 2, the signal output electrode 301 is opaque, and the signal output electrode 301 and the first light shielding layer 500 are formed in a same layer and made of a same material.

In the above solution, when the signal output electrode 301 is fabricated, the same patterning process may be directly used to directly form the first light shielding layer 500. In this way, the design of the film layer of the photoelectric conversion array substrate may be simplified and improved, a separate light shielding layer may be avoided, and the photoelectric detection accuracy of the photoelectric conversion array substrate under light condition may be effectively improved.

It should be understood that, in other embodiments, the first light shielding layer 500 may also be formed by using other opaque film layers.

Furthermore, optionally, as shown in FIG. 2, the signal output electrode 301 and the first light shielding layer 500 are connected into an integrated structure.

In the above solution, as shown in FIG. 2, the photodetection unit is disposed on a side of the thin film transistor, the first light shielding layer 500 is directly formed by extending the signal output electrode 301 toward the side where the thin film transistor is located and covering the first protective layer 400.

It should be understood that, the first light shielding layer 500 may also be not integrated with the signal output electrode 301, as long as the patterning process of the signal output electrode 301 is used to directly fabricate the first light shielding layer 500.

In addition, according to some embodiments of the present disclosure, a second light shielding layer disposed in the same layer as a signal line 303 may be included in the photoelectric conversion array substrate.

In addition, in the embodiment provided by the present disclosure, as shown in FIG. 2, a portion of the first protective layer 400 covers the source electrode 204 and the drain electrode 205, and a first via is disposed at a position corresponding to the drain electrode 205; another portion of the first protective layer 400 covers the gate insulating layer 202, the photodetection unit is disposed on the portion of the first protective layer 400 that covers the gate insulating layer 202, and the signal output electrode 301 is electrically connected to the drain electrode 205 through the first via.

In the above solution, after the thin film transistor is formed on the base substrate 100, the base substrate 100 is covered with the first protective layer 400. A portion of the first protective layer 400 covers the thin film transistor, and another portion covers the gate insulating layer 202, wherein the photodetection unit is disposed on the portion that covers the gate insulating layer 202. In this way, the first protective layer 400 may be disposed with a first via at a position corresponding to the drain electrode 205, and the signal output electrode 301 may be fabricated on the first protective layer 400 through a patterning process.

In addition, in a preferred embodiment provided by the present disclosure, as shown in FIG. 2, the photodetection unit and the thin film transistor are further covered with a flat layer 600; the flat layer 600 is covered with a second protective layer 700; the photoelectric conversion array substrate is further provided with a signal line 800, the signal line 800 is disposed on the second protective layer 700, the flat layer 600 and the second protective layer 700 are disposed with a second via at a position corresponding to the transparent electrode of the photodetection unit, and the signal line 800 is electrically connected to the transparent electrode 303 through the second via; a third protective layer 900 covering the signal line 800 is also disposed on the second protective layer 700.

Figure 3:
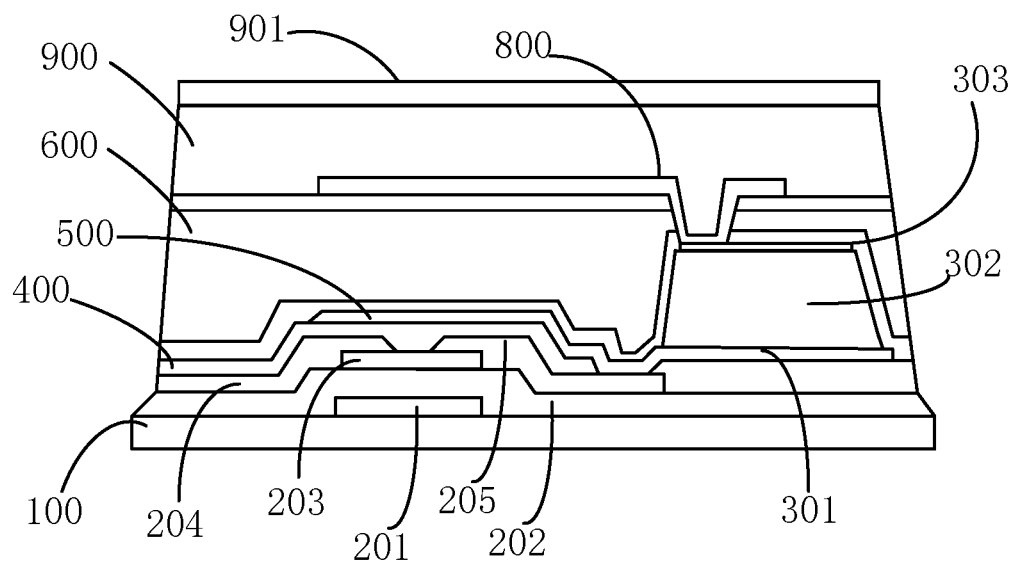
FIG. 3 is a schematic structural diagram illustrating a photoelectric conversion array substrate provided by another embodiment of the present disclosure.

As shown in FIG. 3, according to some embodiments of the present disclosure, the above-mentioned photoelectric conversion array substrate further includes a second light shielding layer disposed on the same layer as the signal line 800, the second light shielding layer is integrated with the signal line 800, an orthographic projection of the second light shielding layer on the base substrate covers at least the orthographic projection of the active layer on the base substrate, that is, the second light shielding layer extends above the source electrode 204 and the drain electrode 205 of the thin film transistor. In this case, by disposing the second light shielding layer and the first light shielding layer, the phenomenon of leakage current of the thin film transistor under light condition may be further improved, thereby improving the detection accuracy of the photodetection unit on the photoelectric conversion array substrate.

The photoelectric conversion array substrate having the above structure may achieve a high light shielding effect, thereby leakage current can be effectively reduced.

In addition, according to some embodiments of the present disclosure, the second light shielding layer and the signal line 303 are made of the same layer and made of the same material, and may be formed through a single patterning process, thus no additional process steps are required.

Optionally, the second light shielding layer may be made of metal material or made of other opaque materials, which is not limited in this application.

In addition, according to some embodiments of the present disclosure, when the photodetection unit of the photoelectric conversion array substrate is fabricated, the transparent electrode 303 made of, for example, the ITO material, is etched once, and then, after the photosensitive layer 302 is etched, the transparent electrode 303 is etched again, so that the projection area of the transparent electrode 303 on the base substrate is retracted inward than the edge of the upper surface area of the photosensitive layer 302, thereby exposing at least a portion of the photosensitive layer 302 near its sidewall. A cross section of the photosensitive layer 302 formed by the above process has a trapezoidal shape, wherein the area of the upper surface of the photosensitive layer 302 is smaller than the area of the lower surface.

Through the above structure, the transparent electrode 303 does not cover an edge area of a sidewall of the photosensitive layer 302, thereby reducing an area covered by the electric field, and thus reducing leakage current caused by surface defects formed after the sidewall of the photosensitive layer 302 is etched.

Figure 4:
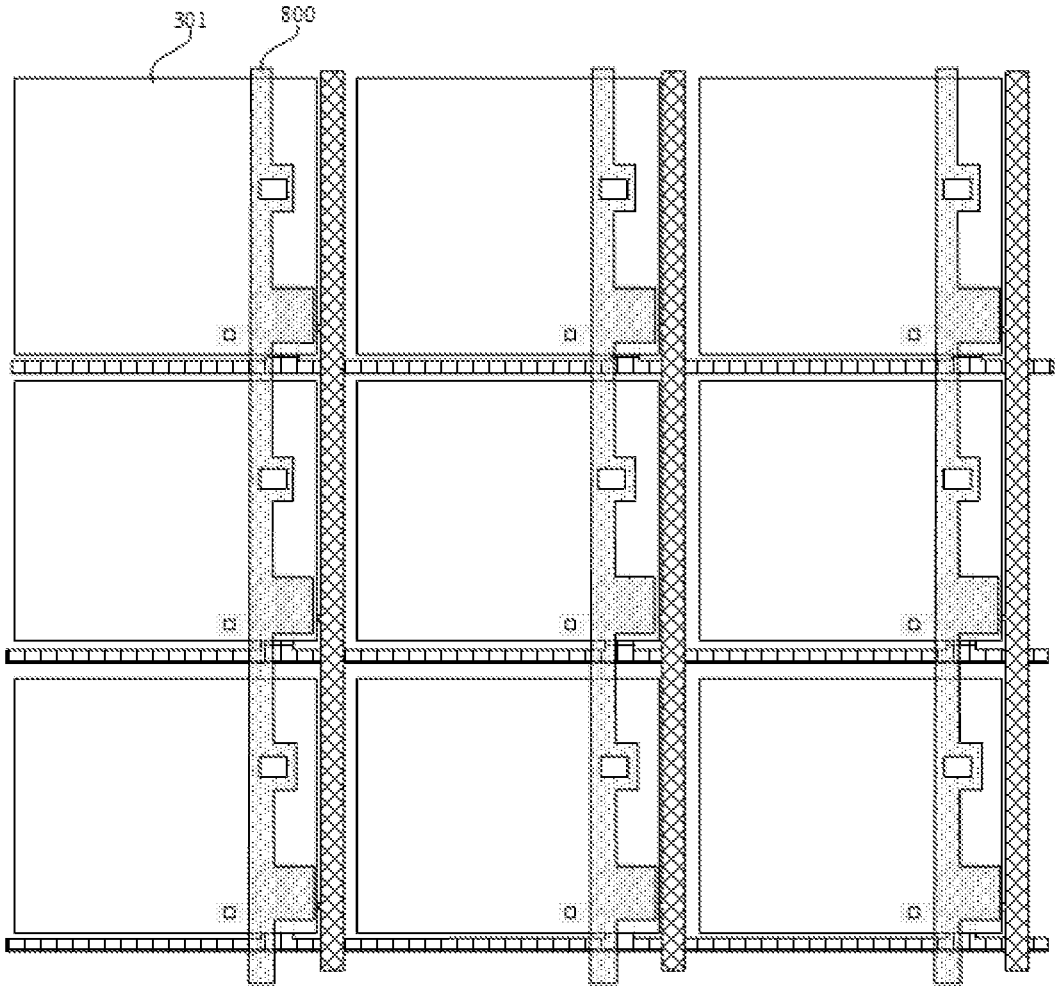
FIG. 4 is a schematic plan view illustrating a photoelectric conversion array substrate provided by an embodiment of the present disclosure.
Figure 5:
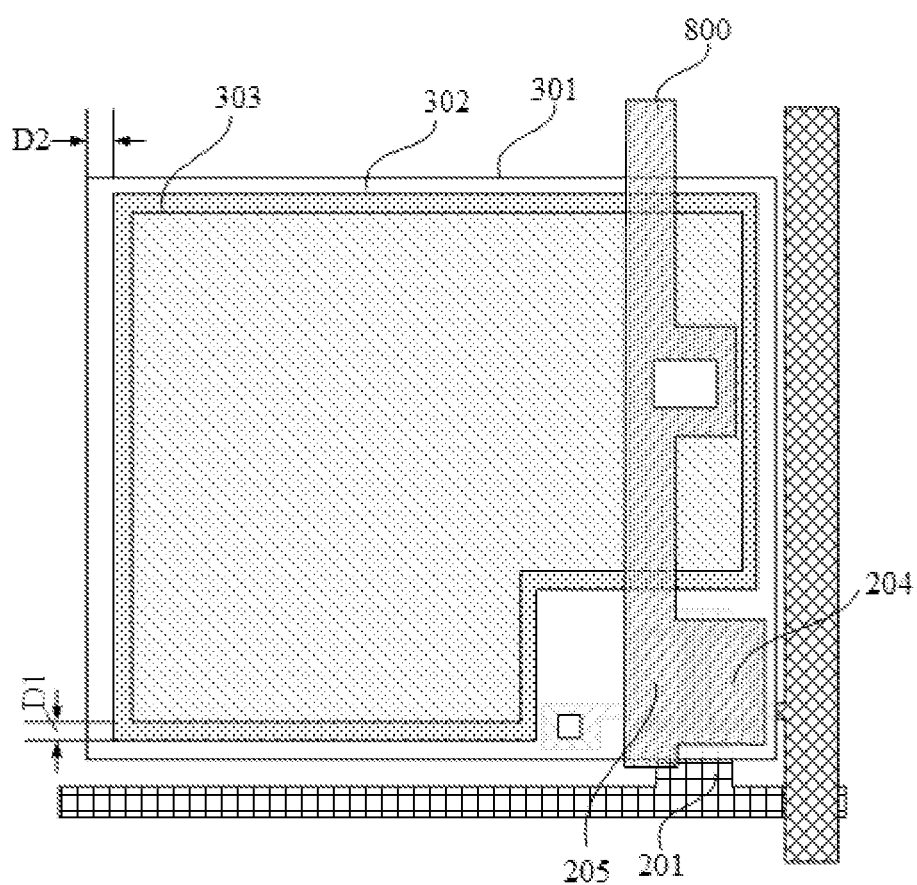
FIG. 5 is a partial enlarged plan view of that shown in FIG. 4.

FIG. 4 and FIG. 5 are schematic top views illustrating a photoelectric conversion array substrate according to an embodiment of the present disclosure. As shown in FIG. 5, the first light shielding layer 500 disposed in the same layer and disposed with the same material as the signal output electrode 301 covers at least the active layer of the thin film transistor. In addition, as can be seen from FIG. 5, an orthographic projection of the transparent electrode 303 on the base substrate 100 is located within an orthographic projection of the photosensitive layer 302 on the base substrate 100, and the orthographic projection of the photosensitive layer 302 on the base substrate 100 is located within an orthographic projection of the signal output electrode 301 on the base substrate 100. As described above, this structure is advantageous for reducing the leakage current generated on the photosensitive layer 302.

According to some embodiments of the present disclosure, the photoelectric conversion array substrate includes a scintillation layer 901 located on a side of the photosensitive layer away from the base substrate 901, and configured to convert X-ray photons into visible light. The scintillator layer covers the entire sensing area of the array substrate.

In addition, in the embodiment provided by the present disclosure, the photosensitive layer 302 includes:

a photodiode for converting the visible light converted by the scintillator layer into an electrical signal.

By adopting the above solution, the photoelectric conversion array substrate may be used as a photoelectric array substrate of an XRD sensor, and the photodiode may be a PIN photodiode.

Certainly, it may be understood that, the photoelectric conversion array substrate may also be other types of photoelectric sensors, for example, the photosensitive layer 302 may also be a photoelectric sensor capable of converting visible light into electrical signals.

In addition, an embodiment of the present disclosure also provides a photoelectric conversion device including the photoelectric conversion array substrate provided by the embodiment of the present disclosure. The photoelectric conversion device is an XRD sensor.

The descriptions above are only embodiments of the disclosure, it should be noted that the improvements and the substitutions within the scope of the technical tenets of the disclosure shall be within the protection range of the disclosure to those of ordinary skill in the art.

What is claimed is:

1. A photoelectric conversion array substrate, comprising:
   a base substrate;
   a thin film transistor located on the base substrate, wherein the thin film transistor comprises a gate, a gate insulating layer disposed on the gate, an active layer disposed on the gate insulating layer, and a source electrode and a drain electrode located on the active layer;
   a photodetection unit located on the base substrate, wherein the photodetection unit comprises a signal output electrode located on the base substrate, a photosensitive layer located on the signal output electrode, and a transparent electrode located on the photosensitive layer, the signal output electrode is electrically connected to the drain electrode, and an orthographic projection of the transparent electrode on the base substrate is located within an orthographic projection of the photosensitive layer on the base substrate;
   a first protective layer covering the source electrode and the drain electrode, and a first light shielding layer disposed on the first protective layer, wherein an orthographic projection of the first light shielding layer on the base substrate covers at least an orthographic projection of the active layer on the base substrate;
   the signal output electrode is opaque, and the signal output electrode and the first light shielding layer are formed in a same layer and made of a same material;
   a portion of the first protective layer covers the source electrode and the drain electrode, and a first via is disposed at a position corresponding to the drain electrode;
   another portion of the first protective layer covers the gate insulating layer, the photodetection unit is disposed on the portion of the first protective layer that covers the gate insulating layer, and the signal output electrode is electrically connected to the drain electrode through the first via;
   the photodetection unit and the thin film transistor are covered with a flat layer;
   the flat layer is covered with a second protective layer;
   the photoelectric conversion array substrate is provided with a signal line, the signal line is disposed on the second protective layer, the flat layer and the second protective layer are disposed with a second via at a position corresponding to the transparent electrode of the photodetection unit, and the signal line is electrically connected with the transparent electrode through the second via;
   wherein the photoelectric conversion array substrate further comprises a second light shielding layer disposed on a same layer as the signal line, wherein the second light shielding layer is integrated with the signal line.

2. The photoelectric conversion array substrate according to claim 1, wherein, the signal output electrode and the first light shielding layer are connected into an integrated structure.

3. The photoelectric conversion array substrate according to claim 1, wherein, a third protective layer covering the signal line is disposed on the second protective layer.

4. The photoelectric conversion array substrate according to claim 1, wherein, a distance between an edge of the orthographic projection of the transparent electrode on the base substrate and an edge of the orthographic projection of the photosensitive layer on the base substrate is 1-3 microns.

5. The photoelectric conversion array substrate according to claim 4, wherein the distance between the edge of the orthographic projection of the transparent electrode on the base substrate and the edge of the orthographic projection of the photosensitive layer on the base substrate is 2 microns.

6. The photoelectric conversion array substrate according to claim 1, wherein, the orthographic projection of the photosensitive layer on the base substrate is located within an orthographic projection of the signal output electrode on the base substrate.

7. The photoelectric conversion array substrate according to claim 6, wherein, a minimum distance between an edge of the orthographic projection of the photosensitive layer on the base substrate and an edge of the orthographic projection of the signal output electrode on the base substrate is 1-6 microns.

8. The photoelectric conversion array substrate according to claim 1, further comprising:
   a scintillation layer located on a side of the photosensitive layer away from the base substrate, and configured for converting X-ray photons into visible light.

9. A photoelectric conversion device, comprising the photoelectric conversion array substrate according to claim 1.

* * * * *